United States Patent [19]

Lindsay

[11] Patent Number: 4,820,885

[45] Date of Patent: Apr. 11, 1989

[54] MAGNETIC GASKET FOR SHIELDING AGAINST ELECTROMAGNETIC RADIATION

[76] Inventor: Tom E Lindsay, 1607 Hamilton Ave., Palo Alto, Calif. 94303

[21] Appl. No.: 100,930

[22] Filed: Sep. 25, 1987

[51] Int. Cl.⁴ .............................................. H05K 9/00
[52] U.S. Cl. ................................. 174/35 GC; 49/478
[58] Field of Search ........... 174/35 GC; 219/10.55 D; 361/424; 49/478

[56] References Cited

U.S. PATENT DOCUMENTS

| | | | |
|---|---|---|---|
| 2,659,115 | 11/1953 | Anderson et al. | 49/277 |
| 2,659,116 | 11/1953 | Korb | 49/478 |
| 2,659,118 | 11/1983 | Anderson et al. | 49/478 |
| 3,260,788 | 7/1966 | Stetson | 174/35 GC |
| 3,889,043 | 7/1975 | Ducros | 174/35 GC |
| 3,969,572 | 7/1976 | Rostek | 174/35 MS |
| 4,590,710 | 5/1986 | Newland | 49/478 |
| 4,652,695 | 3/1987 | Busby | 174/35 GC |
| 4,659,869 | 4/1987 | Busby | 174/35 GC |

OTHER PUBLICATIONS

Beck et al., *Gasket Retainer* IBM Technical Disclosure Bulletin, vol. 20 No. 11A p. 4495 Apr. 1978.

"Bunting: Flexible Permanent Magnetic Strip" Brochure, Bunting Magnetics Co.

*Primary Examiner*—A. T. Grimley
*Assistant Examiner*—David A. Tone
*Attorney, Agent, or Firm*—Majestic, Parsons, Siebert & Hsue

[57] ABSTRACT

An electromagnetic interference (EMI) shielding gasket for use with removable and hinged panels of enclosures of electronic equipment, where it is necessary to limit the escape or entrance of electromagnetic radiation through a gap between the panel and enclosure. The gasket includes an elongated metal strip having a clip for easy attachment to the panel or enclosure. The strip carries flexible, electrically conductive sheet material that provides the shield. The sheet material is attached to the strip in a manner to provide a cavity therebetween along their length. A free floating elongated magnet is positioned within the cavity so that it urges the conductive sheet material against an edge of a mating piece of the enclosure by magnetic attraction. The structure conforms to surfaces with significant variations, thereby providing an effective shield, and also assists in maintaining the panel closed against the enclosure.

12 Claims, 2 Drawing Sheets

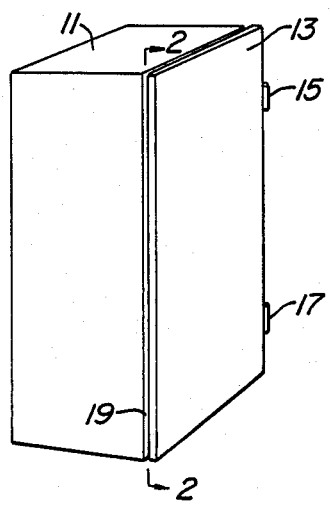
FIG._1.
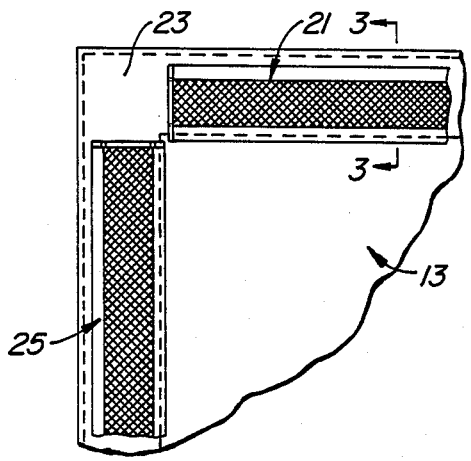
FIG._2.
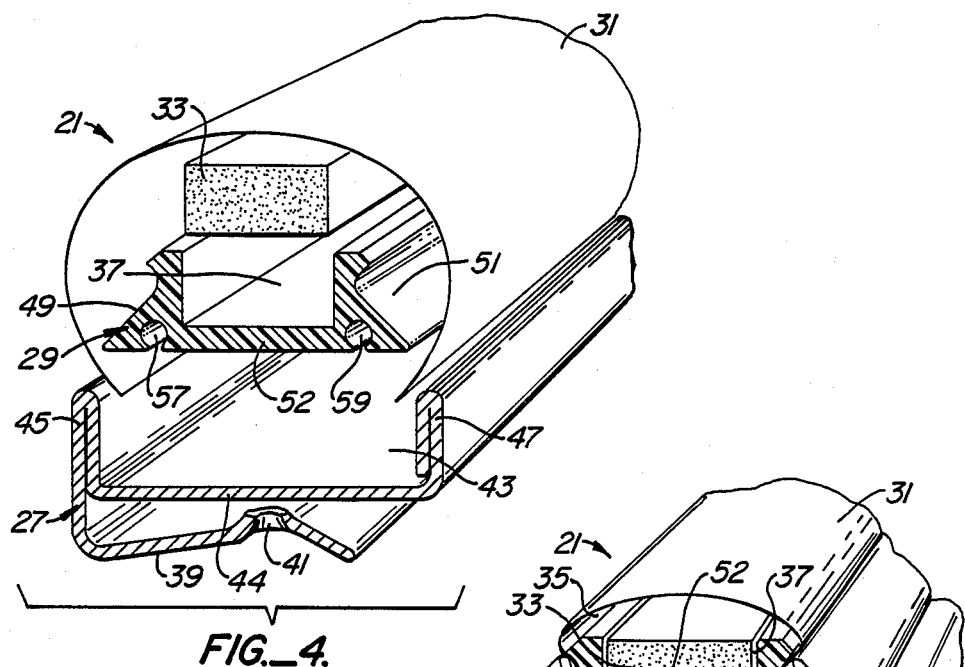
FIG._4.
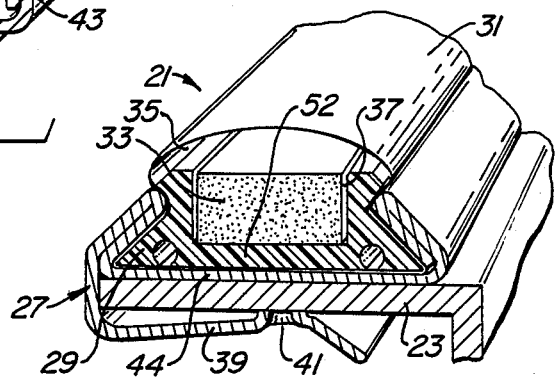
FIG._3.

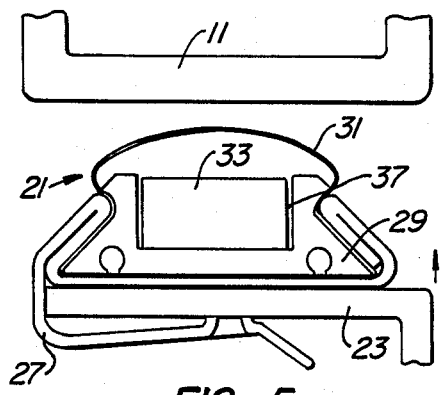
FIG._5.
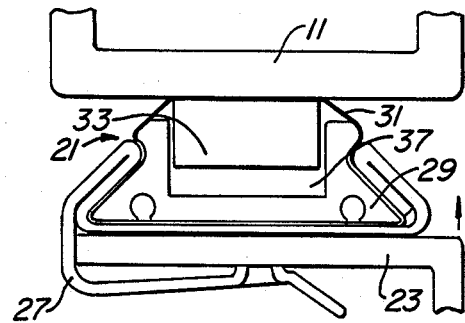
FIG._6.
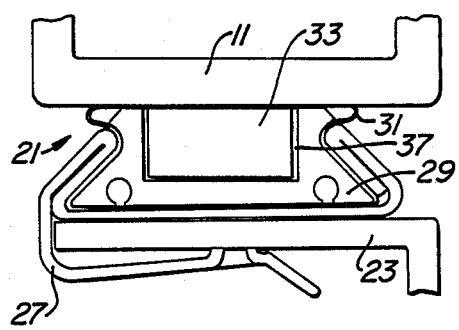
FIG._7.
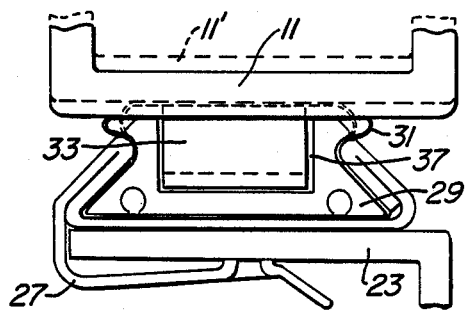
FIG._8.
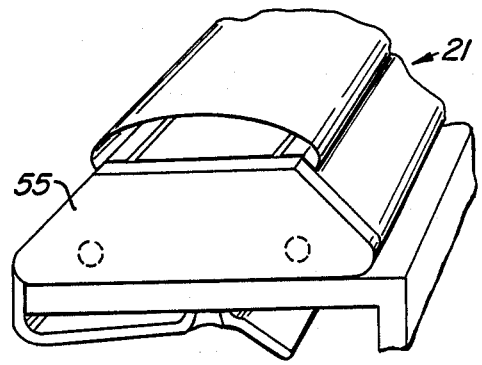
FIG._9.
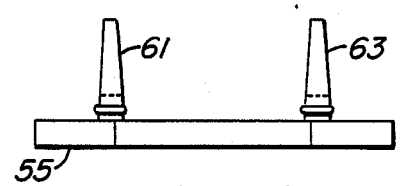
FIG._10.

MAGNETIC GASKET FOR SHIELDING AGAINST ELECTROMAGNETIC RADIATION

BACKGROUND OF THE INVENTION

This invention relates generally to the field of electromagnetic shielding of electronic equipment, and particularly relates to a gasket for providing such shielding around doors, or other panels, of cabinets, or other enclosures, of electronic equipment.

Manufacturers and users of electronic equipment are now required by law to limit the amount of electromagnetic radiation emitted by such equipment. Any such stray radiation, if the levels are high enough, can interfere with the proper operation of other equipment and communications links. Further, it is usually desirable to shield a piece of electronic equipment against receiving electromagnetic interference from some source outside of its cabinet.

Therefore, it has become quite common to surround electronic components with electrically conductive cabinets or chassis, usually made of metal. Of course, such enclosures must contain openings for access to the electronic equipment therein. The openings are usually covered by a hinged door or removable panel, generally also made of metal. Since gaps resulting around the edges of such closures can allow electromagnetic energy to pass through, it is a common practice to seal the gaps with an electrically conductive gasket. Such a gasket is attached to either the equipment cabinet around the opening, or to the door or other panel around its edges.

There are many specific configurations of gaskets used for this purpose. The most common are compressable types designed to fill the gap as the door or panel is latched to the cabinet and pulled against it by some other mechanism. Examples of various specific forms of such gaskets include those made of metal spring material (such as berrilym copper), metal mesh, metal mesh surrounding a compressable elastomeric core, and a conductive elastomer strip by itself. An example of a gasket having a wire mesh around an elastomeric core is given in U.S. Pat. No. 4,652,695—Busby (1987). An example of a gasket using a conductive polymer is provided by U.S. Pat. No. 4,659,869—Busby (1987). The example gaskets of these two patents also have a clip for easy attachment to the cabinet or door.

Such compressive types of gaskets require that a separate mechanism be used to compress it by latching the door or other panel to the cabinet. These mechanisms have generally tended to be complicated, thus expensive and labor-intensive to install. Often they are not reliable in providing continuous compression at all points along the length of the gasket, which is necessary to provide an effective electromagnetic radiation seal. Therefore, other gaskets include magnetic elements which are attracted to the other of the cabinet or door from that to which the gasket is attached, in an attempt to improve the seal. Examples of different configurations of this type of gasket are given in the following U.S. Pat. Nos.: 3,260,788—Stetson (1966); 3,889,043—Ducros (1975); 3,969,572—Rostek (1976); and 4,590,710—Newland (1986).

It is a general object of the present invention to provide an electromagnetic radiation shielding gasket having improved characteristics over those of the prior art. It is a specific object of the present invention to provide a gasket that provides a better seal in situations where the gaps between the surfaces being sealed are dimensionally irregular or where the surfaces themselves are irregular. It is also an object of this invention to provide a gasket structure that can be economically and commercially manufactured in large volumes. It is yet another object of the present invention to provide a gasket that is easy to install.

SUMMARY OF THE INVENTION

These and additional objects are accomplished by the various aspects of the present invention, wherein, briefly, an elongated, flexible magnet is allowed to float free within the gasket between a mounting strip that is attachable to the cabinet or door being sealed and a flexible, electrically conductive sheet material such as a conductive fabric. The magnet is not attached to either the mounting strip or the flexible sheet material. This allows the magnet to firmly compress the conductive sheet material against the element to which it is primarily attracted, the opposite of the cabinet or door to which the mounting strip is attached. Since the flexible magnet is not restrained by other components of the gasket, it can conform the conductive sheet material very closely to any variations in the surface to which the magnet is attracted. The magnetic attraction in an opposite rearward direction, toward the mounting strip, is made to be less so that the magnet automatically moves out toward the opposite surface as the element to which the gasket is attached is brought close to that other surface. Once contact with that other surface is made by the primary magnetic attraction, the rearward magnetic attraction pulls the mounting strip toward the magnet, thus resulting in holding the door or other panel against the cabinet. No latch mechanisms are required to compress the gasket in order to provide an effective shield, and, in many cases, the magnetic attraction of the gasket will provide all the closure force necessary without the need for extra latching mechanisms.

Additional objects, advantages, and features of the present invention are given in the following detailed description of its preferred embodiment, which description should be taken in conjunction with the accompanying drawings.

BRIEF DESCRIPTION OF THE DRAWINGS

FIG. 1 shows an example of a cabinet with a door that is sealed thereto by means of a gasket according to the present invention;

FIG. 2 shows a portion of the door of FIG. 1 with a gasket installed;

FIG. 3 is a cross-sectional view of an installed gasket according to the present invention, taken at section 3—3 of FIG. 2;

FIG. 4 is an exploded view of the gasket shown in FIG. 3;

FIGS. 5-8 show in cross section the operation of a gasket when a door to which it is attached is closed;

FIG. 9 is a view of an end of the gasket of the present invention with an end cap attached; and FIG. 10 is a top view of an end cap installed in the gasket of FIG. 9.

DESCRIPTION OF A PREFERRED EMBODIMENT

As an example of an application of the gasket of the present invention, a cabinet 11 is shown in FIG. 1 to have a door 13 attached thereto by hinges 15 and 17. It is a gap 19 between the cabinet and the door that is desired to be entirely blocked by an electrically conductive gasket. Radio frequency and other electromagnetic radiation emissions from electronic equipment within the cabinet 11 are then attenuated to acceptable levels. Conversely, radiation signals for noise external to the cabinet 11 are prevented from entering the cabinet and interfering with the proper operation of electronic equipment therein.

The gasket can be attached to either of the mating cabinet or door surfaces, but in the example being described, the more usual attachment of the gasket to the door 13 is given. As illustrated in FIG. 2, an elongated gasket section 21 is provided along an internal surface of the door 13, clipped to an edge flange 23 and oriented in a horizontal direction. Similarly, the top of the door 13 carries an elongated gasket section 25 oriented in a vertical direction.

A preferred specific structure for such a gasket is shown in the cross-sectional view of FIG. 3, wherein the gasket 21 is illustrated with the door open; that is, without the gasket operating to seal the gap between the door and the cabinet. Briefly, the major components of this gasket structure will be described. An electrically conductive mounting strip 27 is shaped to form a channel in which a non-magnetic insert 29 is held. Very flexible, electrically conductive sheet material 31 is also attached to the strip 27 in a manner to be in electrical contact therewith. An elongated, flexible magnet 33 is held within a cavity 35 that is formed between the insert 29 and the sheet material 31. A slot 37 is provided along the length of the gasket for constraining movement of the magnet 33 in a single direction outward from the strip 27 and toward it. A clip piece 39 is provided as part of the strip 27 for firmly grabbing the flange 23 of the door 13. The clip portion includes a plurality of tines along its length, such as a tine 41, each having sharp edges that will cut through any paint or other electrically insulating coating on the surfaces of the flange 23, in order to make sure a good electrical contact is formed between the strip 27 and the door edge flange 23 for proper shielding.

An exploded view of FIG. 4 best shows how the gasket is made and its construction. The strip 27 is preferably roll-formed from a continuous metal strip into a shape shown in FIG. 4. The insert 29, preferably an extruded plastic piece, is positioned in a channel 43 of the strip 27. Alternatively, the insert 29 may be formed by injection molding. The flexible conductive sheet material 31, preferably a conductive cloth of woven or knitted fabric because of its high degree of flexibility in all directions, is frictionally engaged between the inside surfaces of sidewalls 45 and 47, and a bottom 44, of the metal strip 27, and mating surfaces 49, 51 and 52, respectively, of the plastic insert 29. The edges of the strip sidewalls 45 and 47 are hemmed (rounded) in order to avoid any sharp edge which may cause the sheet material 31 to tear in operation. It will be noted that the upper edges of the surfaces 49 and 51 of the insert 29 are also rounded in order to avoid sharp edges, but are primarily shaped to mate with the rounded edges of the respective edges 45 and 47 of the strip 27. This results in firmly attaching the sheet material 31 between the sidewalls of the strip 27 and the sidewalls of the plastic insert 29, providing a good mechanical hold. This also provides very good electrical contact between the conductive sheet material 31 and the metal strip 27. As can be seen from comparing FIGS. 3 and 4, the intermediate shape of the strip 27 in FIG. 4 is altered in the final product by bending the sidewalls 45 and 47 in order to firmly press the sheet material 41 against the plastic insert 29.

A principal feature of the example gasket structure being described is that the magnet 33 is freely floating within the cavity 35 formed between the plastic insert 29 and the flexible sheet material 31. It is the ability of the magnet 33 to move outward and firmly compress the sheet material 31 against the cabinet edge, and to conform to surface irregularities of that edge, which is an important feature of this embodiment. The magnetic piece 33 is purposely not attached to any other element of the gasket in order that it have that action. Although the slot 37 of the plastic insert 29 limits movement of the magnet from side to side, the width of the slot is made to be somewhat larger than the width of the magnet 33 so that it does not impede movement of the magnet into and out of the slot. In order that the magnet 33 is guided in its movement at all times, the depth of the slot 37 in the plastic insert, the thickness of the magnet 33, and position of the sheet material 31 all cooperate to make sure that the magnet 33 does not completely escape the slot 37. Some portion of the width of the magnet 33 will always be within the slot 37, or else its proper operation could be impeded.

Although the magnet 33 could have any cross-sectional shape that allowed it to mechanically conform to the other elements, the rectangular shape illustrated in this example is preferred since it provides a large surface of contact against the sheet material 31, and thus the opposing surface of the cabinet. This adds additional insurance that close contact is made without any gaps or holes that might result from an irregular cabinet surface against which the magnet 33 is urged. The flexibility of the magnet 33 also greatly aids in sealing irregular gap surfaces. Such flexible permanent magnetic strips are readily commercially available, such as those from Bunting Magnetics Company of Newton, Kans.

Operation of the gasket being described, and additional structural features thereof, are illustrated with respect to the cross-sectional views of FIGS. 5-8. In FIG. 5, the door to which the gasket 29 is attached is approaching a sealing surface of the cabinet 11. The magnet 33 is held at the bottom of the slot 37 of the plastic insert 29 by its magnetic attraction to the metal strip 27, usually but not necessarily made of magnetic material, and to the edge piece 23 of the door, which is almost certainly made of steel or some other magnetic material. As the gasket comes close to the sealing edge of the cabinet 11, however, the unrestrained magnet 33 will move outward of the slot 37 by attraction to the cabinet portion 11, as shown in FIG. 6. This occurs when the cabinet portion 11 gets close enough to the magnet 33 that the magnetic forces therebetween are stronger than the forces between the magnet 33 and the strip 27, which tend to hold the magnet within the channel 37. The magnetic forces holding the magnet 33 in the slot 37 are attenuated by the base thickness of the plastic insert 29 under the slot 37. In the structure shown, the magnet 33 has an equal magnetic force in both directions and the plastic insert 29 serves to effectively reduce those forces in a rearward direction.

As an alternative structure, the same effect can be accomplished by a magnet 33 being chosen that has a greater level of magnetic flux on its surface facing the sheet material 31 than in the opposite rearward direction facing the bottom of the strip 27, either with the spacer of the plastic insert 29, or without it.

The next step in the operation of the gasket 21 is shown in FIG. 7. Once a magnet 33 is compressing the sheet material 31 against cabinet frame portion 11, the magnetic attractive forces between the magnet 33 and the strip 27 and door frame portion 23 caused the door to move toward the cabinet until the magnet 33 is again seated in the channel 37, as shown in FIG. 7. This is a two-step closure operation that does not require, in the usual case, any latches or other elaborate fastening mechanisms between the door and the cabinet. The thickness of the magnet 33 should not be significantly less than the depth of the slot 37, in order for the gasket 21 to operate in the preferred way described, but the magnet 33 can be thicker than the slot 37. However, it is preferable that the thickness of the magnet 33 be approximately equal to the depth of the slot 37, as shown in the drawings.

In the usual case, the cabinet surface 11 is not an exact plane along its length, having surface irregularities to which the flexibility of the magnet 33 allows it to conform. This is illustrated in FIG. 8, wherein a distant section of the cabinet portion 11 is shown in dotted outline, the magnet 33 there bending outward of the slot 37 to maintain compression against the fabric 31 and the surface portion 11'.

Since the magnet 33 is free floating and unrestrained within the gasket 21, some means must be provided in order to prevent the magnet from falling out of the gasket structure when it is placed upright. This is accomplished, in a preferred form, by an end cap 55, shown installed on an end of gasket 21 in FIG. 9, and shown in plan view in FIG. 10. It is conveniently attached to the gasket 21 by providing a pair of spaced-apart slots 57 and 59 in the plastic insert 29, into which are inserted force-fit studs 61 and 63, respectively, of the end cap 55. Extruding the insert 29 provides slots 57 and 59 along the entire length of the insert 29 so that an end cap 55 may be installed at any position where the gasket 21 is cut to fit a particular application.

Although the various aspects of the present invention have been described with respect to a specific example, it will be understood that the invention is entitled to protection within the full scope of the appended claims.

It is claimed:

1. A structure for shielding against electromagnetic energy penetration around edges of an enclosure opening when covered by a removeable or hinged panel, comprising:
   an elongated, electrically conductive, rigid strip adapted to be held adjacent to an edge of the enclosure opening by one of said panel or said enclosure,
   flexible, non-magnetic, electrically conductive sheet material carried by said strip along its length in a manner to provide an elongated enclosed space between them, and
   an elongated, flexible magnet contained in said enclosed space in a manner to be free floating therein and unattached to either the strip or the sheet material.

2. The structure of claim 1 which further includes means for causing said magnet to have a greater magnetic attraction in a direction away from said strip than in a direction toward said strip.

3. The structure of claim 2 wherein said magnet attraction causing means comprises a non-magnetic insert carried by said strip in said enclosed space between said strip and said magnet.

4. The structure of claim 1 wherein said sheet material is a woven or knitted fabric.

5. A structure for shielding against electromagnetic energy penetration around edges of an enclosure opening when covered by a removeable or hinged panel, comprising:
   an elongated, electrically conductive, rigid strip adapted to be held adjacent an edge of the enclosure opening by one of said panel or said enclosure,
   a non-magnetic insert attached to said strip,
   flexible, non-magnetic, electrically conductive sheet material held between the strip and insert in a manner to provide a cavity that extends along a length of the structure, and
   an elongated, flexible magnet contained in said cavity in a manner to be free floating therein and unattached to any of the strip, insert or sheet material, thereby allowing the magnet to move away from the rigid piece as the other of said panel or an edge adjacent said enclosure opening comes close to said strip.

6. The structure of claim 5 wherein said insert is made of plastic.

7. The structure of claim 5 wherein said sheet material is a woven or knitted fabric.

8. The structure of claim 5 wherein said insert includes a slot opening in a direction away from said strip, said slot having a width slightly larger than that of the magnet, thereby to guide a path of movement of the magnet within said cavity.

9. The structure of claim 8 wherein said slot has a height that is related to a thickness of the magnet and the interior dimensions of said cavity such that movement of the magnet is constrained to remain in said slot.

10. The structure of claim 5 wherein said sheet material is held by frictional compression between sides of said insert and edges of said strip.

11. The structure of claim 5 wherein said strip additionally includes a clip adapted to attach the structure to the enclosure edge, said clip including at least one tine provided to cut through any insulative coating on said enclosure.

12. The structure of claim 5 wherein said insert includes at least one opening extending along its length adjacent said strip, and further wherein said structure comprises at least one cap at an end of said enlonged structure, said cap having at least one stud inserted into said at least one insert opening, whereby an end of the structure is sealed to prevent the free floating magnet from moving longitudinally out of said cavity.

* * * * *